United States Patent [19]

Nadahara et al.

[11] Patent Number: 5,360,748
[45] Date of Patent: Nov. 1, 1994

[54] METHOD OF MANUFACTURING A SEMICONDUCTOR DEVICE

[75] Inventors: Soichi Nadahara, Tokyo; Kikuo Yamabe, Kanagawa, both of Japan

[73] Assignee: Kabushiki Kaisha Toshiba, Kanagawa, Japan

[21] Appl. No.: 7,876

[22] Filed: Jan. 22, 1993

[30] Foreign Application Priority Data

Jan. 24, 1992 [JP] Japan .................................. 4-011109

[51] Int. Cl.$^5$ .......................................... H01L 21/306
[52] U.S. Cl. .......................................... 437/11; 437/10; 437/12; 437/247; 148/DIG. 60
[58] Field of Search ............... 437/20, 11, 12, 234, 437/247; 148/DIG. 60, DIG. 61, DIG. 24

[56] References Cited

U.S. PATENT DOCUMENTS 4,053,335 10/1977 Hu ................................ 148/DIG. 60
4,608,096 8/1986 Hill ........................................ 437/234
4,645,546 2/1987 Matsushita ................. 148/DIG. 60

FOREIGN PATENT DOCUMENTS 0254737 12/1985 Japan .
60-254737(A) 12/1985 Japan .
0173131 7/1991 Japan ..................................... 437/12

Primary Examiner—Tom Thomas
Assistant Examiner—Tuan Nguyen
Attorney, Agent, or Firm—Finnegan, Henderson, Farabow, Garrett & Dunner

[57] ABSTRACT

A method of manufacturing a semiconductor device, which comprises the steps of providing a semiconductor substrate having a first primary surface which is designated to form the semiconductor device and a second primary surface opposite from the first primary surface, the substrate containing contaminants therein; forming a boron-doped layer on the second primary surface of the substrate; and absorbing the contaminants into the boron-doped layer.

11 Claims, 7 Drawing Sheets

METHOD OF MANUFACTURING A SEMICONDUCTOR DEVICE

BACKGROUND OF THE INVENTION

1. Field of the Invention

This invention relates to a method of manufacturing semiconductor devices. More particularly, it concerns such a method by which contaminants, such as heavy metals, are removed from or prevented from inclusion in a semiconductor device when formed.

2. Description of the Related Art

In the manufacture of semiconductor devices, contaminants, particularly heavy metal contaminants such as Fe, Cu, and the like, are unintentionally mixed into the materials used for the manufacture and are precipitated in a substitutional site or an interstitial site of a semiconductor substrate, such a silicon substrate. As a result of the contaminants, generation recombination centers are formed, leakage currents at PN junctions are incurred, and the life of excess carriers is shortened. The electric characteristics of the device are also deteriorated by contaminants of the type referred to.

For example, in a MOS (metal oxide semiconductor) type memory device, when generated excess carriers, such as electrons or holes, are diffused in a silicon substrate, the stored charges in a charge stored memory cell are decreased in number. If the stored charges are decreased in number to total less than a critical charge, the state of the memory cell is inverted "1" to "0" and the storage data is lost.

Also, in a CCD (charge coupled device), excess carriers from a generation recombination center, are detected as a signal together with excess carriers caused by incident light. As a result, the excess carriers from the generation recombination center may provide an overly strong signal resulting in a white spot, for example, and the image quality is reduced.

Also, in a bipolar device, a generation recombination center becomes a cause of increased leakage currents at the PN junction. Excess charges generated in a base region are transferred to an output as an extraordinary signal, so low frequency noise is increased.

As mentioned above, the contamination by heavy metals causes the deterioration of the electric characteristics of the various semiconductor devices. Particularly, in the manufacture of an ULSI (Ultra Large Scale Integration) device, even if only a small quantity of contaminants are present in the device, the operating characteristics of the device are greatly deteriorated or changed Therefore, the contaminants become a main cause of decreased yield in the manufacture of semiconductor devices.

Two conventional techniques have been used to solve the problems associated with contaminants, i.e., sterilization and gettering.

Super cleaning technology has been developed to facilitate the manufacture of semiconductor devices by avoiding contaminants such as may be present in chemicals, e.g., hydrogen fluoride, nitric acid, hydrochloric acid, hydrogen peroxide, ammonium fluoride, and sulfuric acid, or deionized water, which are used in processes for manufacture of the device; or in the atmosphere such as dust in a clean room, and dust present on operators, and resist films, and dust represented by particles generated by several kinds of apparatus used for the manufacturing processes.

However, even if this technology is used to clean the environment for manufacturing an ULSI device, for example, as well as the material to be used, and to reduce the contaminants from the apparatuses used, it is difficult to completely control all of the process steps, e.g., several hundred steps, at the degree of cleanliness required for manufacture of the ULSI device. Thus, contamination in the course the process steps has continued to be a known statistical probability. That is, even if the presence of contaminants is controlled in all processes, the possibility for contamination is increased with increased numbers of the process steps so that generation of contamination cannot be avoided.

Examples of the so called gettering method of removing contaminants from active regions of a semiconductor device include, for example, phosphorus gettering, backside damage gettering and intrinsic gettering. In phosphorus getting, phosphorus is diffused from a back surface of a wafer during the final manufacturing process so that contaminants are moved from the wafer to an interface between the wafer substrate and the diffused phosphorus layer, and the contaminants are thus removed from active regions of a device. The phosphorus gettering is carried out, for example, by using $POCl_3$ as a source gas and by exposing the wafer to an oxidized atmosphere at a temperature of between 900° C. and 1000° C.

In backside damage gettering, a mechanical strain is first intentionally imposed on the back surface of a wafer. Thereafter, during a first step for oxidizing in a ULSI manufacturing process, for example, oxidation induced stacking faults are caused at a nucleus caused by the mechanical strain. Contaminants like heavy metals are collected at the nucleus.

The mechanical strain is imposed, for example, by blowing fine $SiO_2$ particles toward the back surface of the wafer. Because the oxidation induced stacking faults are grown fastest in an oxidization process at a temperature of 1100° C., this gettering is especially effective in a high temperature process.

In intrinsic gettering, after a precipitate nucleus of oxygen is formed at a low temperature thermal process, such as at 650° C. to 750° C., oxygen is precipitated at a high temperature, such as 1000° C. to 1100° C. and heavy metals are taken into the oxygen. Also, to prevent generating precipitates at a surface of an active device region, a high temperature (e.g., 1200° C.) thermal process is carried out in many cases before the low temperature of thermal process. The low temperature thermal process is usually carried out during a step for manufacturing a wafer, and the high temperature thermal process is carried out during a step for manufacturing an ULSI.

However, these gettering methods have problems. That is, a gettering method carried out during a process step for manufacturing a semiconductor wafer, such as damage gettering or intrinsic gettering referred to above, create a problem of increasing costs to form the wafer. Also, even in phosphorus gettering, as a gettering process is added, costs are likely to be increased.

Moreover, a high temperature thermal process, such as gettering, might create a problem. That is, because an ULSI is manufactured at microminiaturization scale, the distance between each device becomes extremely short. As a result, formation of a PN junction by ions, such as phosphorus, arsenic, or boron, and a partial doping by the ions should be carried out at a low temperature of less than 900° C., for example, 800° to 850°

C. However, as described above, in damage gettering, a high temperatures of more than 1000° C. are necessary for the growth of oxidation-induced stacking faults. In intrinsic gettering, a temperature of more than 900° C. is required to precipitate oxygen. Also in phosphorus gettering, due to a dependency on the temperature of the diffusion coefficient of phosphorus, the diffusion of phosphorus cannot be fully effected at other than high temperatures.

Therefore, because of the microminiaturized ULSI manufacture, a gettering at a low temperature is needed. However, contaminants cannot be removed fully at such the low temperature using the current state of the gettering arts. Accordingly, a method of manufacturing semiconductor devices, which can fully remove contaminants at relatively low temperatures, is desired.

SUMMARY OF THE INVENTION

The present invention has been made in view of the above circumstances and has as an object to provide a method of manufacturing a semiconductor device, which can fully remove Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims To achieve the objects and in accordance with the purpose of the invention, as embodied and broadly described herein, the method of manufacturing a semiconductor device of this invention comprises the steps of providing a semiconductor substrate having a first primary surface which is designated to include the semiconductor device and a second primary surface opposite from the first primary surface, the substrate receiving contaminants therein during manufacture of the semiconductor device, forming a boron-doped layer on the second primary surface of the substrate, and absorbing the contaminants into the boron-doped layer.

The objects and purpose of the invention are further achieved and served by the provision of a method of manufacturing a semiconductor device comprising the steps of providing a semiconductor substrate having opposite first and second primary surfaces, the first of which is designated to receive the formed semiconductor device, the substrate receiving contaminants therein during manufacture of the semiconductor device, forming a semiconductor layer containing boron on the second primary surface of the substrate, and forming the semiconductor device using at least one thermal process during which heat is applied to the substrate. The same heat applied during formation of the device is used to remove contaminants from the substrate into the semiconductor layer containing boron.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

DETAILED DESCRIPTION OF THE PREFERRED EMBODIMENTS

Figure 1A:
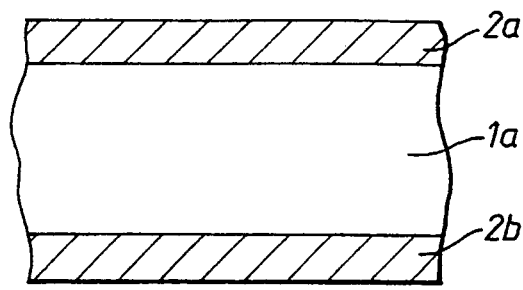
FIG. 1(a) and FIG. 1(b) are sectional views depicting a first process embodiment of the present invention.
Figure 1B:
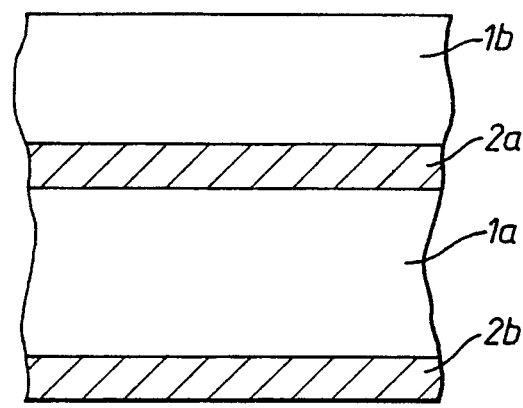

FIG. 1(a) and 1(b) show sectional views of a semiconductor device in a manufacturing process according to a first embodiment of the present invention. This embodiment makes use of a method of contacting two wafers directly.

In FIG. 1(a), the reference character 1a designates a silicon substrate with a crystallographic orientation of (100). The substrate is of n-type silicon and has a resistivity of 10 ncm. Boron-doped polysilicon layers 2a and 2b, 400 nm in thickness, and having a boron concentration of more than $10^{20}$ atoms/cm$^3$ on opposite sides of the substrate 1a. The boron-doped polysilicon layer 2a and the boron-doped polysilicon layer 2b function as a gettering site and a gettering barrier, respectively. The layers 2a and 2b are formed at temperatures approximating 600° C., for example.

As shown in FIG. 1(b), a silicon substrate 1b, the specification of which is the same specification as silicon substrate 1a, is bonded in tight contact to gettering site 2a. A desired semiconductor device (not shown in FIGS. 1(a) and 1(b)) is then formed on the exposed surface of silicon substrate 1b. The desired semiconductor device may be manufactured using many elevated temperature process steps including annealing processes, e.g., thermal oxidation or thermal diffusion.

According to the first embodiment, heavy metal contaminants, which become contained in silicon substrate 1b, are gathered into gettering site 2a. Therefore, contamination at the active region of the semiconductor device is reduced. The gettering of contaminants occurs during the formation of the boron-doped polysilicon layers 2a and 2b as well as during annealing processes incident to semiconductor device manufacture. The boron-doped layers 2a and 2b prevent gettered contaminants, removed from inside the substrates 1a and 1b, from migrating back into the substrates. The contaminants cannot be released from the layers 2a and 2b even during subsequent annealing process at elevated temperatures. Moreover, gettering barrier 2b prevents an invasion of contaminants from the back side of substrate 1a and diffusion thereof into the designated semiconductor device region. Accordingly, the elimination of contaminants at the region of the semiconductor device improves the yield of device manufacture.

Also, as described below, an important feature of the invention is that in the illustrated embodiment, for example, the gettering ability by the site 2a and the barrier 2b, to remove or exclude contaminants, such as heavy metals, is increased at lower processing temperatures. That is, the removal of contaminants can be achieved effectively at adequately low temperatures to avoid such problems of changing the depth of PN junctions in the semiconductor device during manufacture thereof.

Moreover, in conventional gettering, such as phosphorus gettering, the removal of contamination is carried out as the final step of semiconductor manufacture. According to the present invention, the removal step can be carried out throughout the processing steps of device manufacture. Silicon substrates 1a and 1b can be interchangeable to accommodate structure of the semiconductor device to be manufactured.

In a comparative test experiment, the inventors made a silicon substrate, which was contaminated by using a metal solution, as a sample, and evaluated the gettering ability of a boron-doped polysilicon gettering site, which was formed on the substrate. Measurements were made by a recombination lifetime of minority carriers in the substrate.

More precisely, first the sample was made by immersing a silicon substrate in a 0.1 mol/l of $HNO_3$ solution containing Fe. The concentration of the solution was 1 ppm, so as to forcibly contaminate the substrate. After spin drying and $N_2$ annealing at 1000° C. for about 60 minutes, a boron-doped polysilicon layer was formed on the substrate and then an $N_2$ annealing step was carried out at a temperature of 600° C. for about 1 hour. This $N_2$ anneal corresponds to an annealing process in the manufacture of a semiconductor device. Also, the surface of the silicon substrate was etched for about 40 $\mu$m in depth, by using a nitrous acid solution. A diffusion length of minority carriers was measured by using a surface photovoltage (s.p.v.) method. Also a recombination lifetime of the minority carriers could be found, as the result of the s.p.v. method.

Figure 2:
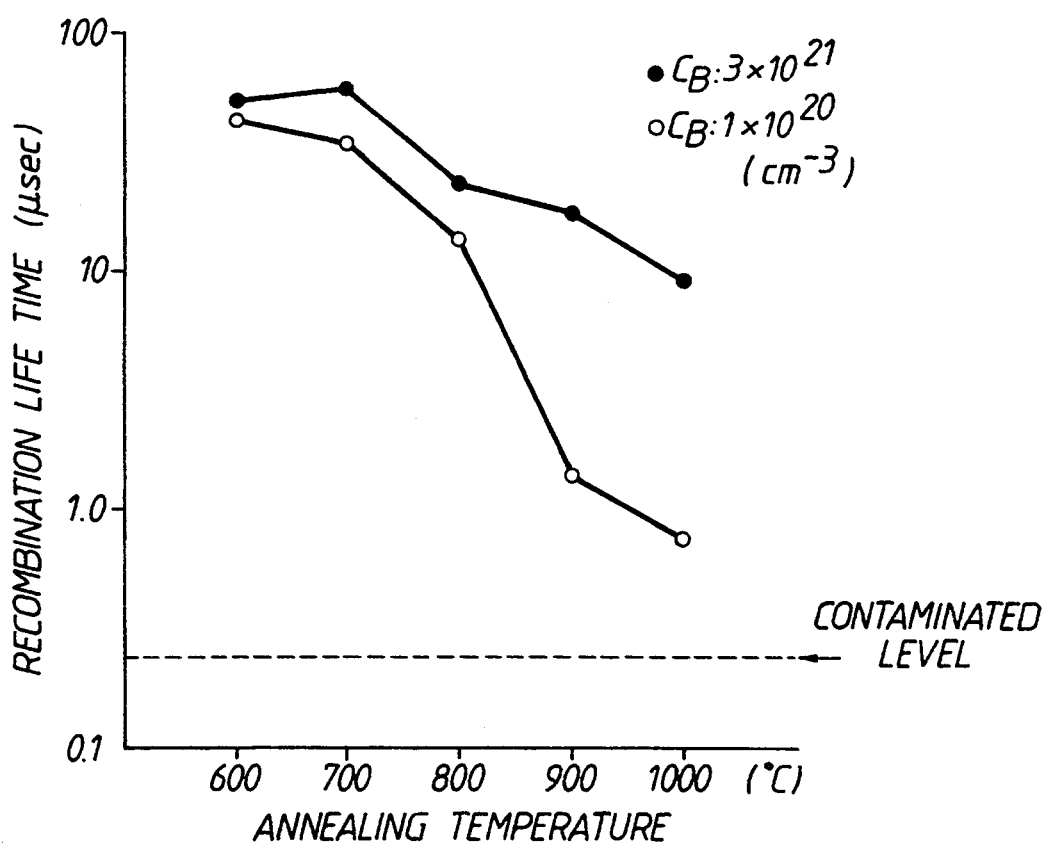
FIGS. 2-4 are characteristic graphs to explain the present invention.

FIG. 2 is a characteristic graph, which shows the results of the measurements. This graph shows a relationship between the recombination lifetime and the temperature of the thermal annealing ($N_2$ anneal). In this graph, black points show the result of a first case using a boron-doped polysilicon layer having a boron concentration of $3 \times 10^{21}$ [$cm^{-3}$]. White points show the result of another case that used a boron-doped polysilicon layer having a boron concentration of $1 \times 10^{20}$ [$cm^{-3}$].

As is apparent from the graph, as the annealing temperature became higher, the recombination lifetime became shorter. This means that a higher gettering effect was obtained at the lower temperatures. Also, if the annealing temperature is the same, a higher boron concentration makes the gettering ability more effective.

Also, to carry out the gettering effectively at the lower temperature, the annealing time should be more than a time needed for heavy metals to move from a surface of the substrate to another surface of the substrate, on which gettering site was formed. This annealing time is dependant on the annealing temperature. That is, if the temperature is higher, the moving speed of the metal within the substrate is increased.

Figure 3:
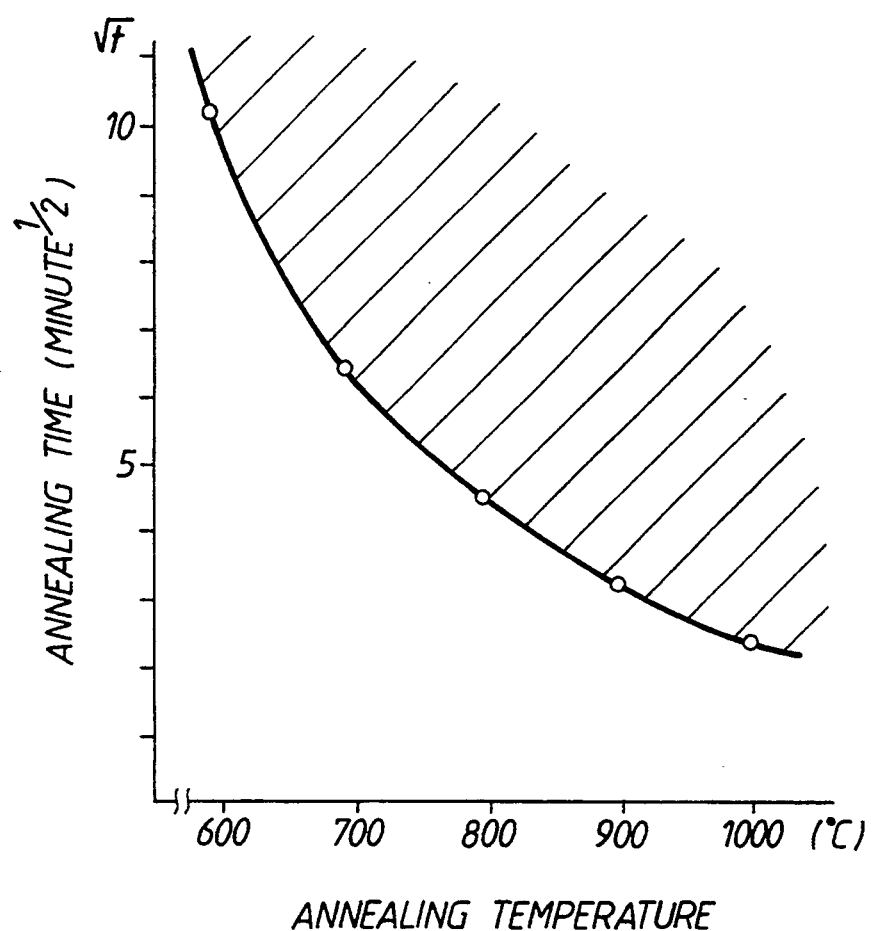

FIG. 3 is a characteristic graph which shows a relationship between annealing times and annealing temperatures. In this graph, the vertical axis represents a root of the annealing time t in minutes and the horizontal axis represents the annealing temperature T in ° C. The curve shown in this graph represents a minimum annealing time for each annealing temperature. The area crosshatched by oblique lines in the graph represents a proper annealing time and the remaining area of the graph represents improper annealing time. For example, annealing times at the temperatures of 600° C., 700° C., 800° C., 900° C. and 1000° C., show 104 minutes, 42 minutes, 21 minutes, 10 minutes, and 6 minutes, respectively.

Figure 4:
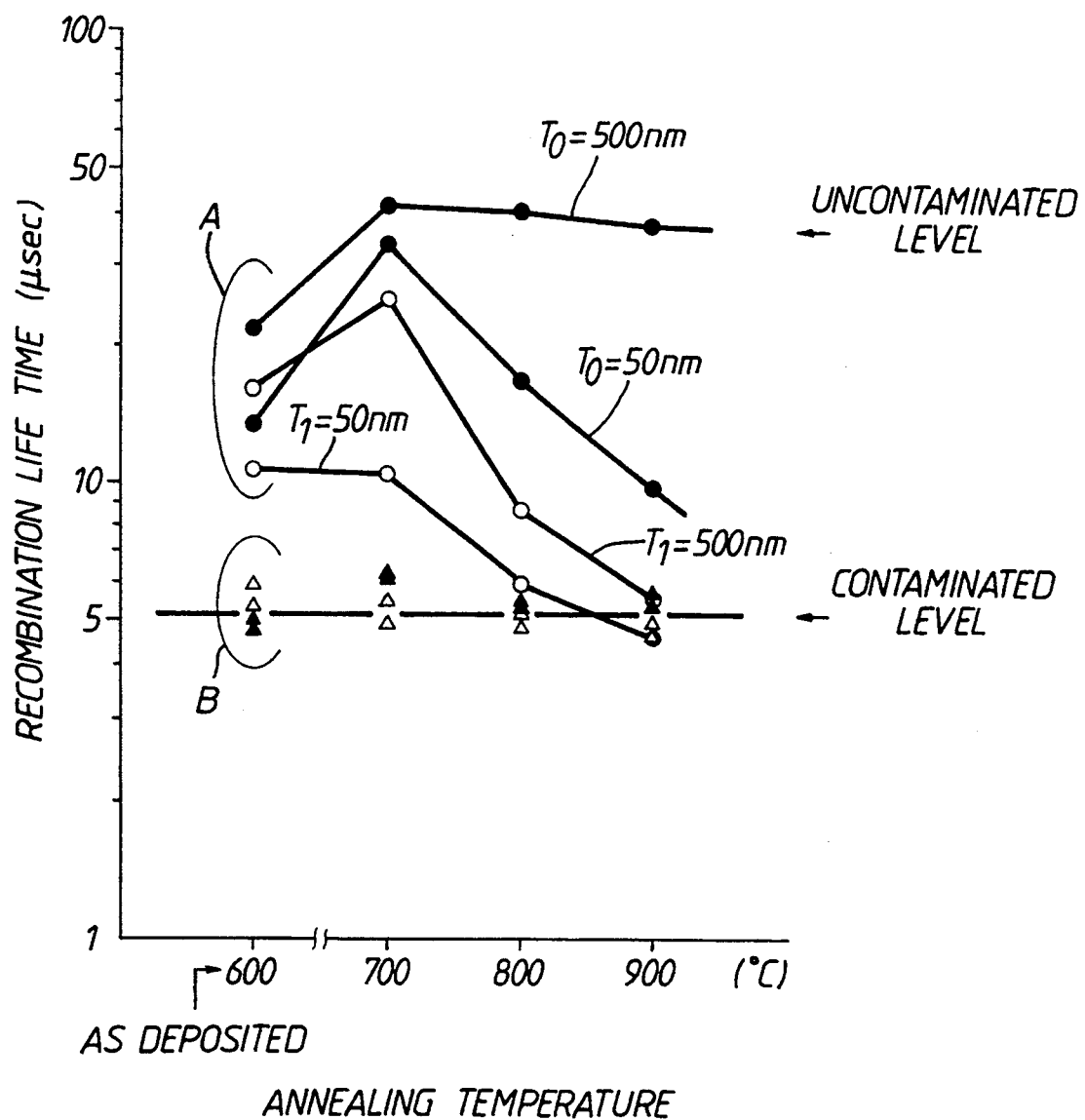

FIG. 4 is a characteristic graph, which shows a relationship between recombination lifetime and annealing temperature. This graph also shows that a boron-doped polysilicon layer contributes to improvement of the effect of gettering the contaminants in the silicon substrate.

In the graph of FIG. 4, data in group A shows the result of a case in which a silicon layer was formed on the silicon substrate. Black points were the results of a boron-doped polysilicon layer used as the silicon layer. White points were the results of an undoped silicon layer used as the silicon layer. $T_0$ and $T_1$ represent thicknesses of the silicon layers.

On the other hand, data of group B shows the result of a case in which a boron-doped silicon layer was formed on the silicon substrate through an $SiO_2$ layer formed on the silicon substrate.

In this graph, an uncontaminated level means a recombination lifetime of carriers in a silicon substrate which is not contaminated by a metal, such as Fe, and is not gettered.

According to this graph, in the case where the boron-doped layer was formed on the silicon substrate, the gettering increased in effectiveness with increased thickness of the boron-doped layer.

Also, in the case where the undoped silicon layer was formed on the silicon substrate, if the thickness of the undoped layer was increased, the effect of gettering became greater. However, the effect was not greater as compared to the case of using boron-doped silicon layer. Therefore, the undoped silicon layer might not be used in a practical process.

On the other hand, in the case of using the silicon layer through the $SiO_2$ layer formed on the substrate, in both cases using the boron-doped silicon layer and the undoped silicon layer, the effect of the gettering could not be attained.

Under this condition, an improvement of a recombination by absorbing metals, e.g., an improvement of a recombination by precipitating of Fe might be expected, because a solubility limit of Fe might become lower, accompanied with the decrease of the annealing temperature. However, the results of the graph shown in FIG. 4, deny the expectation.

That is, a higher recombination lifetime at the lower temperature could be obtained if the boron-doped silicon layer is formed on the silicon substrate. This does not mean that the improvement was resulted from the decrease of solubility limit of Fe, accompanying the lower temperature of annealing.

Also, as the recombination lifetime of more than 10 is desired, it is understood that an annealing temperature of less than 900° C. is suitable. As a lower limit of temperature, more than 600° C. in the annealing process is desired, considering the aspect of productivity. This is because the mass production would be difficult, as a long annealing time is necessary if the temperature is less than 600° C., as is apparent from the FIG. 3.

FIGS. 5(a)–(d) show sectional views in the manufacturing process of a CMOS transistor, which is an example of ULSI, according to the second embodiment of the present invention.

Figure 5A:
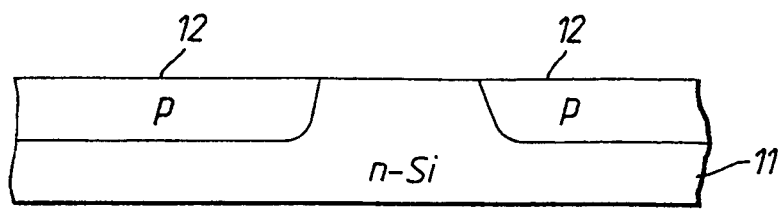
FIGS. 5(a)-5(d) are sequential cross-sectional views depicting manufacture of a CMOS transistor in a second embodiment of the present invention.

First, as shown in FIG. 5(a), boron at a concentration of $1.5 \times 10^{13} \times cm^{-2}$ and at a 160 keV of accelerated voltage is implanted into a predetermined n channel MOS transistor in an n-type substrate 11 having a resistivity of 10 Ωcm. Then, the substrate is annealed at a temperature of 1190° C. for 8 hours and, thereafter, a p well region 12 is formed to separate the surface of substrate 11 into a p MOS region and an n MOS region.

Figure 5B:
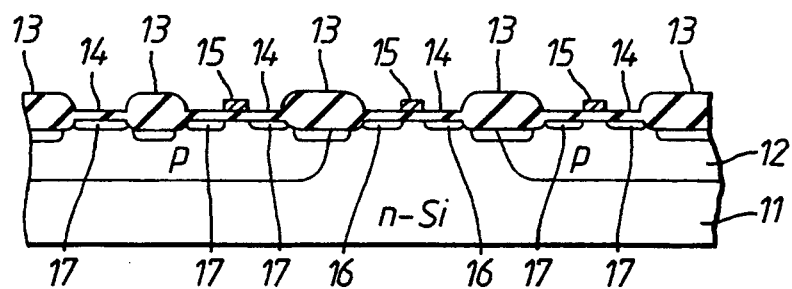

Next, as shown in FIG. 5(b), a thick field oxidation layer 13, such as a layer having a thickness of 700 nm, is selectively formed on substrate 11 to provide an isolation region. Thereafter, a thin oxidation layer 14, 10–20 nm in thickness, is formed as a gate insulating layer. Then an n+ polysilicon layer 15, which is formed by a thermal diffusion of phosphorous into an undoped polysilicon layer, is formed on substrate 11. Then n+ polysilicon layer 15 is patterned as a gate electrode by using a known photo lithographic process.

Next, implantations are made, using gate electrode 15 and field oxidation layer 13 as a mask, to form a p+ impurity layer 16 and an n+ impurity layer 17 in a self alignment manner. According to these implantation processes, source and drain regions of the p-type MOS transistor and the n-type MOS transistor are formed. In these implantation processes, when the p-type impurity is injected into the n-type MOS transistor region, the p-type MOS transistor region is masked by a photoresist. In contrast, when the n-type impurity is injected into the p-type MOS transistor, the n-type MOS transistor region is masked by a photoresist. Group V elements, such as arsenic, are used as the n-type impurity and elements, such as boron, boron fluoride are used as the p-type impurity.

Figure 5C:
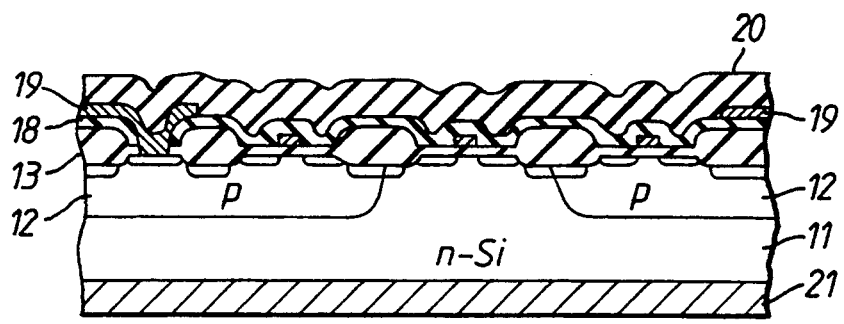

Next, as shown in FIG. 5(c), after a CVD oxidation layer 18 is deposited on the whole of substrate 11, an opening is formed at a predetermined portion in the oxidation film 18. Successively, a polysilicon layer 19 is deposited. After polysilicon layer 19 is patterned as an electrode, an insulating layer 20, 400 nm in thickness, such as a PSG layer or a BPSG layer, is formed on the whole surface of substrate 11.

Next, by a CVD method using a boron-doped gas, such as a gas mixture of $SiH_4$ and $B_2H_6$, a 400 nm thick, boron-doped polysilicon layer 21 is formed on the back side of substrate 11. The concentration of the boron is more than $10^{20}$ atoms/cm$^3$. The conditions for forming the boron-doped layer are substantially the same as the first embodiment described above.

A gettering process to remove contaminants, such as heavy metals, is made within the time needed to form boron-doped polysilicon layer 21 and during annealing processes conducted during manufacture of the semiconductor device. But if a diffusion of the contaminants into the boron-doped polysilicon layer 21 is insufficient during the formation of the layer 21, a lower temperature, e g , less than 900° C. could be added successively to this process.

Figure 5D:
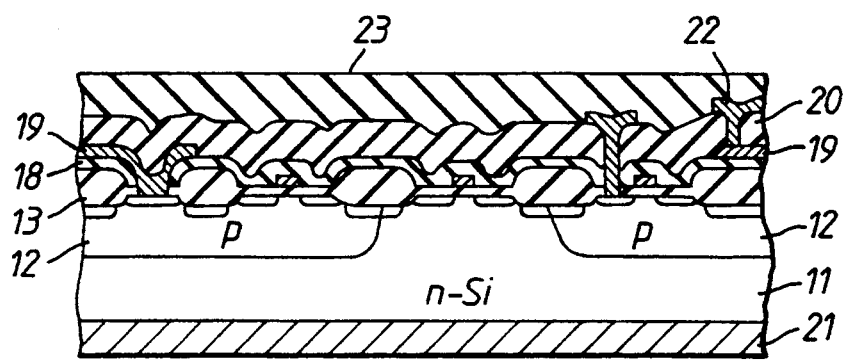

As shown in FIG. 5(d), a contact hole is formed in insulating layer 20. A metallization process is carried out and a metal pattern 22 is formed by a known etching process. Then an N2 annealing at a temperature of 450° C. for 15 minutes is carried out.

Finally, to protect the device manufactured in these processes, a passivation layer 23 is deposited on the surface of substrate 11 and a CMOS transistor is completed.

The inventors examined leakage currents of CMOS transistors manufactured by the method according to the above second embodiment and the method according to the conventional method.

Figure 6:
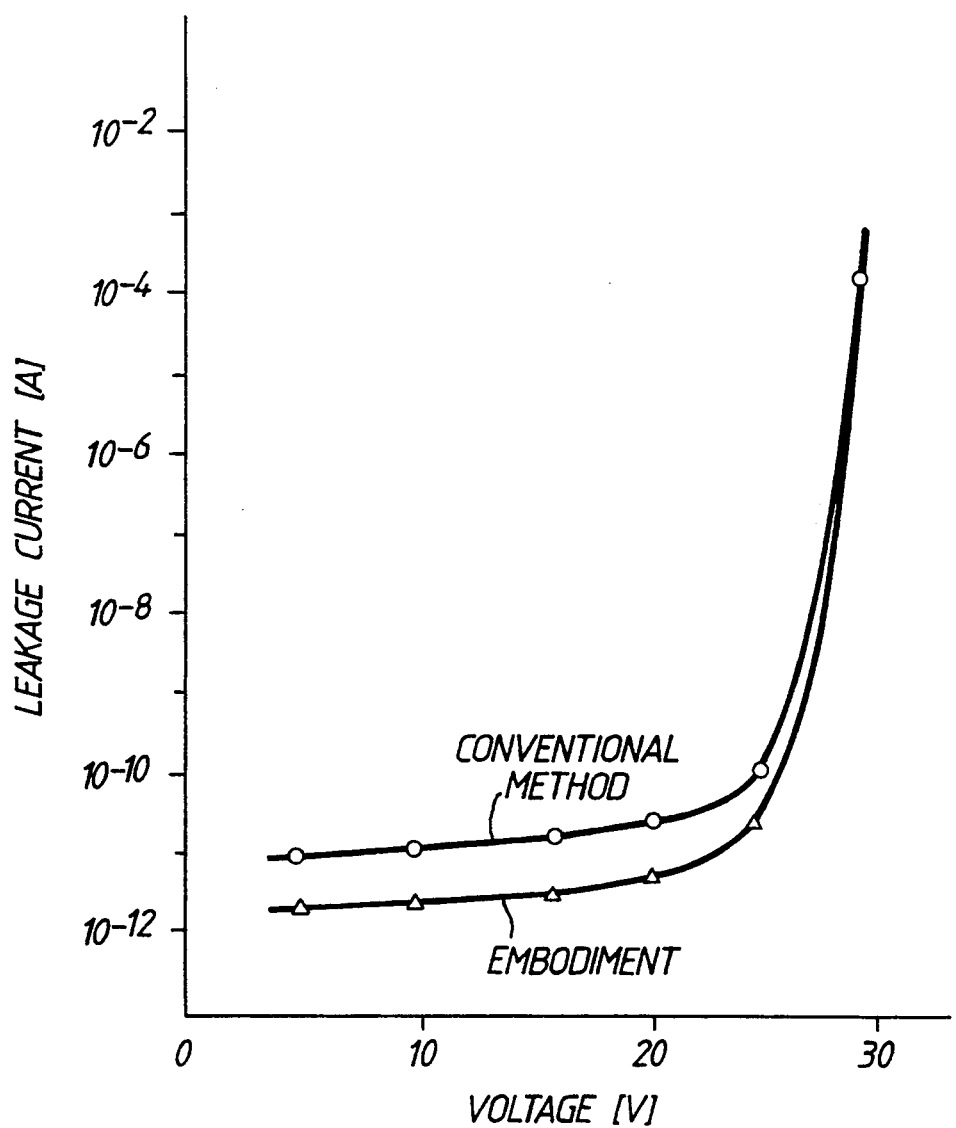
FIG. 6 is a characteristic graph to compare the conventional method and the present invention.

FIG. 6 shows a relationship of voltage versus leakage currents in a comparison of the leakage currents of the two types of transistors. It is apparent from FIG. 6, that a leakage current in the CMOS transistor of the second embodiment, including the process of gettering, is an order of magnitude smaller than that of the device manufactured by the conventional method. According to the second embodiment, by forming boron-doped polysilicon layer 21 in the manufacturing process of the device, a CMOS transistor having low current leakage can be obtained.

In the second embodiment, a silicon substrate, on which a gettering site and a gettering barrier are formed, could be bonded in tight contact to silicon substrate 11, and thereafter the CMOS could be manufactured. Moreover, a passivation layer, e.g., made of an oxidation layer or a nitride layer could be formed on the gettering barrier.

FIG. 7(a)–FIG. 7(e) show successive sectional views representing the manufacture of a part of a DRAM cell, which is the other according to the third embodiment of the present invention.

Figure 7A:
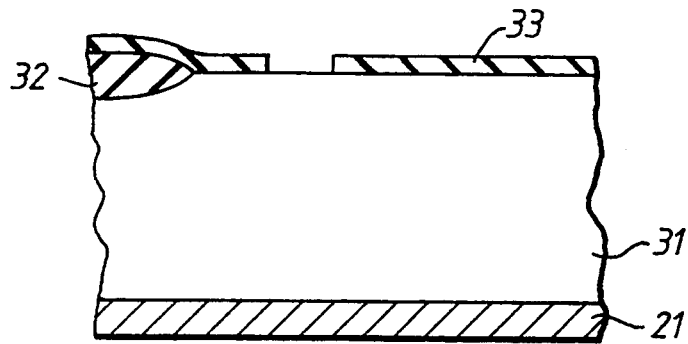
FIGS. 7(a)-7(e) are sequential cross-sectional views depicting manufacture of a DRAM cell in a third embodiment of the present invention.

First, as shown in FIG. 7(a), after a field oxidation layer 32 is selectively formed on a p-type silicon substrate 31 having resistivity of 10 Ωcm, an 0.8 μm thick CVD oxidation layer 33 is selectively deposited. Next, according to a known CVD method using $SiH_4$ gas and $B_2H_6$ gas, a 400 nm thick, boron-doped polysilicon layer 21, having a concentration of more than $10^{20}$ atoms/cm$^3$, is formed as a gettering site at the back side of silicon substrate 31.

The condition of forming the boron-doped layer is substantially the same as the first embodiment. A process to remove contaminants is carried out during a thermal process in the manufacture of a device. This process might be a process to form a thermal oxidation layer or a process to form a gate oxidation layer.

To prevent boron-doped polysilicon layer 21 from thinning during the thermal process, it is desired that an insulating layer be provided as a protect layer, such as an $SiO_2$ layer, or SiN layer on boron-doped polysilicon layer 21.

After this, an opening is formed at a designated capacitor region of the surface of substrate 31, by using a known photolithographic etching process.

Figure 7B:
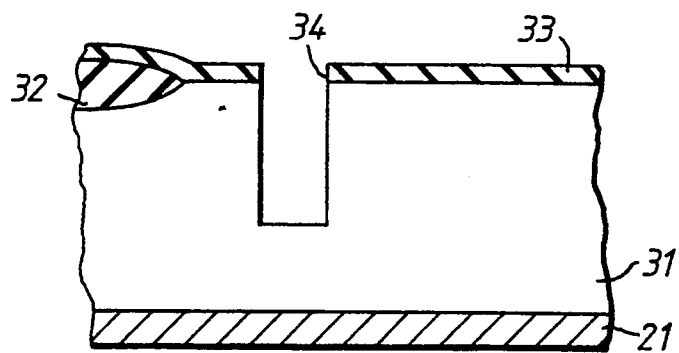

Next, as shown in FIG. 7(b), substrate 31 is etched by using CVD oxidation layer 33 as a mask, to form a 3 μm deep of trench 34 having a perpendicular side wall at a portion where a MOS capacitor of DRAM is going to be formed. The etching of substrate 31 is made by a reactive ion etching (RIE) method, using an etching gas, which mainly contains $CF_4$, $SF_6$, or $CCl_4$ or the etching gas added H containing gas.

In the case of RIE method, if a usual photoresist is used as a mask, it is likely for the mask itself to be etched. Therefore, it is desired that a stacked insulating layer, such as an $SiO_2/Si_2N_4/SiO_2$ layer, is used.

Figure 7C:
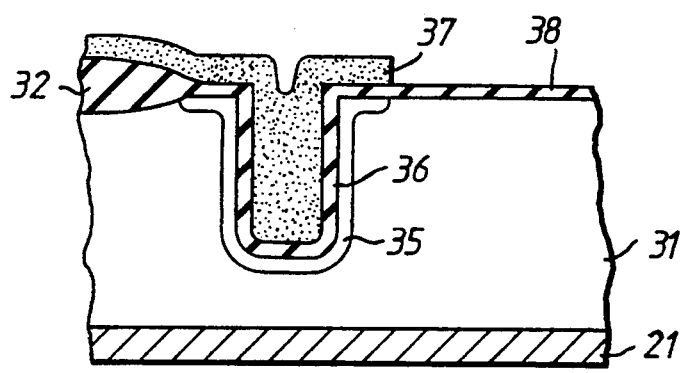

As Shown in FIG. 7(c), after CVD oxidation layer 33 is removed, an n− layer 35 is formed on the exposed silicon substrate 31. Successively, a thermal oxidation layer 36 as a capacitor insulating layer is formed by a thermal oxidation. And then, after a polysilicon layer is deposited on substrate 31, a capacitor electrode 37 is formed by patterning the polysilicon layer.

Figure 7D:
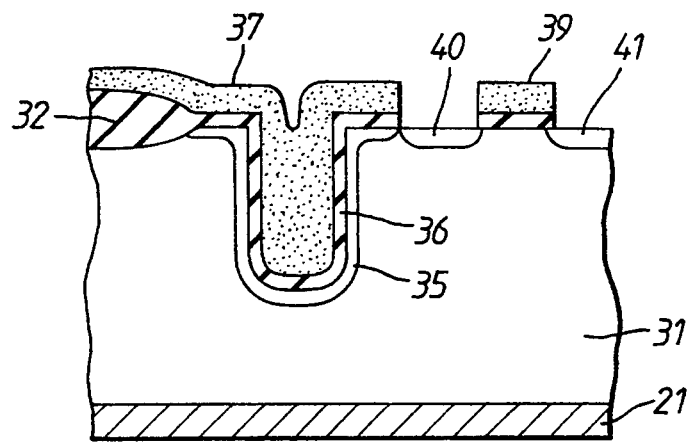

Next, as shown in FIG. 7(d), a thermal oxidation layer 38, as a gate insulating layer, and a gate electrode 39, made of a polysilicon layer, are successively formed at a portion adjacent to the capacitor region. Then, n+ impurity layers 40, 41 as a source and a drain is formed by ion implanting arsenic ions. Gate electrode 39 could be formed by the same material such as a polysilicon layer used in capacitor electrode 37.

Figure 7E:
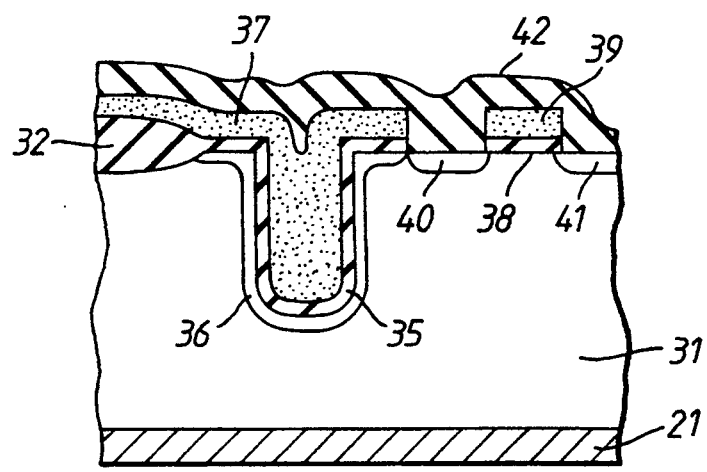

As shown in FIG. 7(e), a 400 nm thick insulating layer 42, such a phosphorus glass material, e.g., PSG or BPSG layer is deposited on the whole surface of substrate 31. After this, by a CVD method using SiH$_9$ gas and B$_2$H$_6$ gas, a 400 nm thick boron-doped polysilicon layer, the boron concentration of the layer being more than $10^{20}$ atoms/cm$^3$, is formed on the back side of substrate 31.

After this, as a process to remove heavy metals, a thermal process at a lower temperature, e g , less than 800° C. for more than 20 minutes is carried out.

If boron-doped polysilicon layer 21 is fully left as the gettering site on the substrate 31, the boron-doped polysilicon layer formed in the above process is not always necessary and the lower temperature thermal process only might be carried out. By this time, the end of semiconductor device formation is reached and no further processing at a temperature more than 600° C. occurs.

Finally, after a metallization process is carried out to form metal wire patterns, a passivation film is deposited on the whole surface of substrate 31 and a DRAM cell is completed.

According to the third embodiment, contaminants, such as heavy metals, which are existent at a device activated area, can be removed in a lower temperature of thermal process during process of manufacturing a DRAM.

Accordingly, a deterioration of the device can be prevented.

Also, silicon substrate 31 can be bonded to a second substrate, on which a gettering site and a gettering barrier are formed in tight contact and thereafter the DRAM cell can be formed, similar to the first embodiment.

Figure 8:
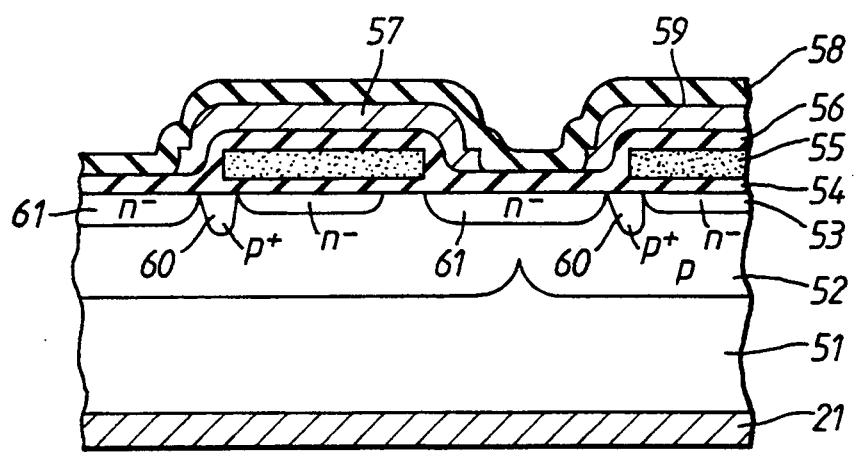
FIG. 8 is a sectional view of a CCD image sensor for describing a fourth embodiment of the present invention.

FIG. 8 shows a sectional view of a pixel in a CCD image sensor, which is another example of ULSI, including a photoelectric conversion device, which concerns a fourth embodiment of the present invention.

A p-type well region 52 is formed in an n-type silicon substrate 51. N-type vertical CCD regions 53 and n-type photodiode regions 61 are mutually formed in p-type well region 52. Vertical CCD regions 53 and photodiode regions 61 are electrically separated by p+ channel stop layers 60.

A gate electrode 55, made of polysilicon layer, is formed through a gate oxidation layer 54 made of SiO$_2$ layer on vertical CCD regions 53.

Moreover, on the gate oxidation layer 54, a CVD oxidation layer 56, such as SiO$_2$ layer and photo shield layers 57, 59 made of Al, are formed in this order. An insulating layer 58, e.g., BPSG layer, is also formed on the shield layer 57, 59. At the back side of substrate 51, a high concentration boron-doped polysilicon layer 21 is formed.

The method of forming the boron-doped polysilicon layer 21 will be described below. At an initial stage of manufacturing the illustrated device, a 0.8 nm thick, silicon oxidation layer is formed as a mask on the back side of the substrate 51, using a CVD method.

Then, according to a CVD method using SiH$_4$ gas and B$_2$H$_6$ gas, a 500 nm thick, boron-doped, polysilicon layer 21 is formed at the back side of substrate 51. The boron concentration of the layer 21 is more than $10^{20}$ atoms/cm$^3$ The layer 21 functions as a gettering site or a gettering barrier.

The condition to form boron-doped polysilicon layer 21 is substantially the same as the first embodiment. After this, a thermal process at a low temperature of 800° C., for more than 20 minutes is carried out. Thereafter, the process to form the p-type well 52 is continued.

According to the fourth embodiment, an invasion of contaminants into substrate 51 from the outside or a removal of contaminants can be achieved by boron-doped polysilicon layer 21. As a result, a generation of recombination center of minority carriers by heavy metals can be prevented and white spots on the image sensor can be reduced.

Also, in this embodiment, after a silicon substrate having a gettering site and a gettering barrier is bonded to silicon substrate 51, the CCD could be formed. A surface of gettering barrier could be covered by a passivation layer, e.g., an oxidation layer or a nitride layer.

Numerous modifications and variations of the present invention are possible in light of the above teachings. It is therefore to be understood that, within the scope of the appended claims, the present invention can be practiced in a manner other than as specifically described herein.

For example, in the above embodiments, the gettering site or the gettering barrier are described using a polysilicon layer. An epitaxial silicon layer can also be used. Also, a process for forming a gettering site or a gettering barrier is not limited in the stage of processes described therein. Moreover, instead of forming a boron-doped silicon layer on the back side of substrate, a boron ion implantation to change the form of back side of substrate into an ion implantation layer can be possible for taking contaminants in the layer. And boron-doped polysilicon layers could be used to a substrate. For example, after a first boron-doped silicon layer is formed under a device region, a second boron-doped silicon layer is formed through a nondoped silicon layer or a silicon substrate. Moreover, a boron-doped silicon layer, which is exposed to the air, e.g., the said second boron-doped layer, might be covered by an oxidation layer or a nitride layer.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claim is:

1. A method of manufacturing a semiconductor device, said method comprising the steps of:

providing a semiconductor substrate having a first primary surface on which the semiconductor device is to be formed and a second primary surface opposite from the first primary surface, the substrate receiving contaminants therein during device manufacture;

forming a separate boron-doped layer on the second primary surface of the substrate; and gettering the contaminants into the boron-doped layer.

2. A method according to claim 1, wherein the gettering step is conducted by using heat applied for an annealing step in the formation of the semiconductor device.

3. A method according to claim 2, wherein the annealing step is carried out at a temperature of 600°–900° C.

4. A method of manufacturing a semiconductor device, said method comprising the steps of:
providing a semiconductor substrate having a first primary surface on which the semiconductor device is to be formed and a second primary surface opposite from the first primary surface, the substrate receiving contaminants therein during device manufacture;
forming a separate semiconductor layer containing boron on the second primary surface of the substrate; and
forming the semiconductor device using at least one thermal process during which heat is applied to the substrate, thereby causing gettering of the contaminants from the substrate into the semiconductor layer containing boron.

5. A method according to claim 4, wherein the thermal process is made at a temperature of 600°–900° C.

6. A method according to claim 4, wherein the thermal process satisfies an upper region of a curve which is formed by plotting (X, Y)—(600, 104), (700, 42), (800, 21), (900, 10) and (1000, 6), wherein X is a thermal process temperature in degrees Centigrade and Y is the thermal process time in minutes.

7. A method of manufacturing a semiconductor device, said method comprising the steps of:
providing a first semiconductor substrate having a first primary surface and a second primary surface opposite from the first primary surface;
forming a first separate semiconductor layer containing boron on the first primary surface and a second separate semiconductor layer containing boron on the second primary surface of the substrate;
providing a second substrate having a first primary surface and a second primary surface directly in contact with the first primary surface of the first substrate,
the first primary surface of the second substrate being designated the surface on which the semiconductor device is to be formed;
forming the semiconductor device using process steps including a thermal process to at least the second substrate; and
gettering contaminants into the first and second boron containing semiconductor layers using the thermal process during forming the semiconductor device.

8. A method according to claim 7, wherein the applied heat is in a temperature range of 600–900° C.

9. A method according to claim 7, wherein the thermal process satisfies an upper region of a curve which is formed by plotting (X, Y)—(600, 104), (700, 42) (800, 21), (900, 10) and (1000, 6) wherein X is a thermal process temperature in degrees Centigrade and Y is the thermal process time in minutes.

10. A method of manufacturing a semiconductor device and comprising the steps of:
providing a semiconductor substrate having opposite first and second primary surfaces;
forming a separate boron-doped layer on one of the first and second surfaces of the substrate; and
forming the semiconductor device using steps including a thermal process satisfying an upper region of a curve formed by plotting (X, Y)—(600, 104), (700, 42), (800, 21), (900, 10) and (1000, 6), where X is a thermal process temperature in degrees Centigrade and Y is the thermal process time in minutes.

11. A method according to claim 10, wherein a boron concentration of the boron-doped layer is more than $10^{20}$ atoms/cm$^3$.

* * * * *